United States Patent
Kim et al.

(10) Patent No.: US 11,211,314 B2
(45) Date of Patent: Dec. 28, 2021

(54) INTERPOSER FOR ELECTRICALLY CONNECTING STACKED INTEGRATED CIRCUIT DEVICE PACKAGES

(71) Applicant: INTEL CORPORATION, Santa Clara, CA (US)

(72) Inventors: Hyoung Il Kim, Folsom, CA (US); Yi Xu, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/633,136

(22) PCT Filed: Sep. 21, 2017

(86) PCT No.: PCT/US2017/052802
§ 371 (c)(1),
(2) Date: Jan. 22, 2020

(87) PCT Pub. No.: WO2019/059913
PCT Pub. Date: Mar. 28, 2019

(65) Prior Publication Data
US 2020/0152558 A1    May 14, 2020

(51) Int. Cl.
*H01L 23/498* (2006.01)
*H01L 21/48* (2006.01)
(Continued)

(52) U.S. Cl.
CPC .... *H01L 23/49811* (2013.01); *H01L 21/4825* (2013.01); *H01L 21/56* (2013.01); *H01L 23/49861* (2013.01); *H01L 24/45* (2013.01); *H01L 24/85* (2013.01); *H01L 25/0657* (2013.01)

(58) Field of Classification Search
CPC ............................. H01L 25/15; H01L 25/065
See application file for complete search history.

(56) References Cited

U.S. PATENT DOCUMENTS

| 2009/0140408 A1 | 6/2009 | Lee et al. |
| 2011/0147908 A1 | 6/2011 | Sun et al. |

(Continued)

OTHER PUBLICATIONS

International Preliminary Report on Patentability for PCT Application No. PCT/US17/52802, dated Apr. 2, 2020.

(Continued)

*Primary Examiner* — Yu-Hsi D Sun
(74) *Attorney, Agent, or Firm* — Essential Patents Group, LLP.

(57) ABSTRACT

An integrated circuit structure may be fabricated having a first integrated circuit package comprising a first integrated circuit device electrically attached to a first surface of a first substrate, a second integrated circuit package comprising a second integrated circuit device electrically attached to a first surface of a second substrate and an opening extending between a first surface of the second substrate and the second surface of the second substrate, and an interconnection structure electrically attached to the first surface of the first substrate, wherein a portion of the interconnection structure extends into the second substrate opening and wherein the interconnection structure is electrically attached to a first surface of the second substrate.

25 Claims, 7 Drawing Sheets

(51) Int. Cl.
*H01L 21/56* (2006.01)
*H01L 23/00* (2006.01)
*H01L 25/065* (2006.01)

(56) References Cited

U.S. PATENT DOCUMENTS

| | | | |
|---|---|---|---|
| 2013/0200524 A1* | 8/2013 | Han | H01L 25/105 257/774 |
| 2016/0343690 A1 | 11/2016 | Fay et al. | |
| 2017/0133351 A1 | 5/2017 | Su et al. | |

OTHER PUBLICATIONS

International Search Report and Written Opinion for PCT Application No. PCT/US17/52802, dated Jun. 21, 2018.

* cited by examiner

INTERPOSER FOR ELECTRICALLY CONNECTING STACKED INTEGRATED CIRCUIT DEVICE PACKAGES

CLAIM OF PRIORITY

This Application is a National Stage Entry of, and claims priority to, PCT Application No. PCT/US17/52802, filed on Sep. 21, 2017 and titled "INTERPOSER FOR ELECTRICALLY CONNECTING STACKED INTEGRATED CIRCUIT DEVICE PACKAGES", which is incorporated by reference in its entirety for all purposes.

TECHNICAL FIELD

Embodiments of the present description relate to the field of integrated circuit device packaging, and, more particularly, to stacked integrated circuit device packages including an interposer electrically connecting at least two integrated circuit package components within the stacked integrated circuit device package.

BACKGROUND

The microelectronic industry is continually striving to produce ever faster, smaller, and thinner integrated circuit packages for use in various electronic products, including, but not limited to, computer server products and portable products, such as wearable integrated circuit systems, portable computers, electronic tablets, cellular phones, digital cameras, and the like. In particular, data center and server markets are continually seeking larger capacity and compact storage solutions.

One way to achieve these goals is by increasing integration density, such as by stacking components within integrated circuit packages. In one example, a storage solution, i.e. memory device, may be a multi-stacked NAND BGA (ball grid array) package, which may comprise 16 stacked NAND devices. In order to increase the storage capacity within the same or similar footprint, there must be greater stacking, such as a 32 stacked NAND device package or the use of package-on-package designs, as will be understood to those skilled in the art. A 32 stacked NAND device package may have an advantage over a package-on-package design with regard to Z-height, but may have higher yield loss. However, package-on-package designs may have challenges with regard to electrically connecting integrated circuit packages therein. In specific, current fabrication technologies, such as laser based processes that may be used to form through mold conductive vias between stacked packages within the package-on-package designs, require relatively large through mold conductive via pitches (i.e. diameters), particularly with regard to high Z-height package-on-package designs. Such relatively large through mold conductive via pitches demand greater space within the package-on-package designs, which is counter to the goal of making smaller integrated circuit packages. Furthermore, as such through mold conductive vias are generally formed at a periphery of the package-on-package designs, they may be susceptible to stress damage due to warpage of the integrated circuit package during fabrication and/or during operation.

Therefore, there is a need to develop novel designs and configurations for electrically connecting stacked integrated circuit device packages within a package-on-package design.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The present disclosure will be described with additional specificity and detail through use of the accompanying drawings, such that the advantages of the present disclosure can be more readily ascertained, in which:

DESCRIPTION OF EMBODIMENTS

Figure 1:
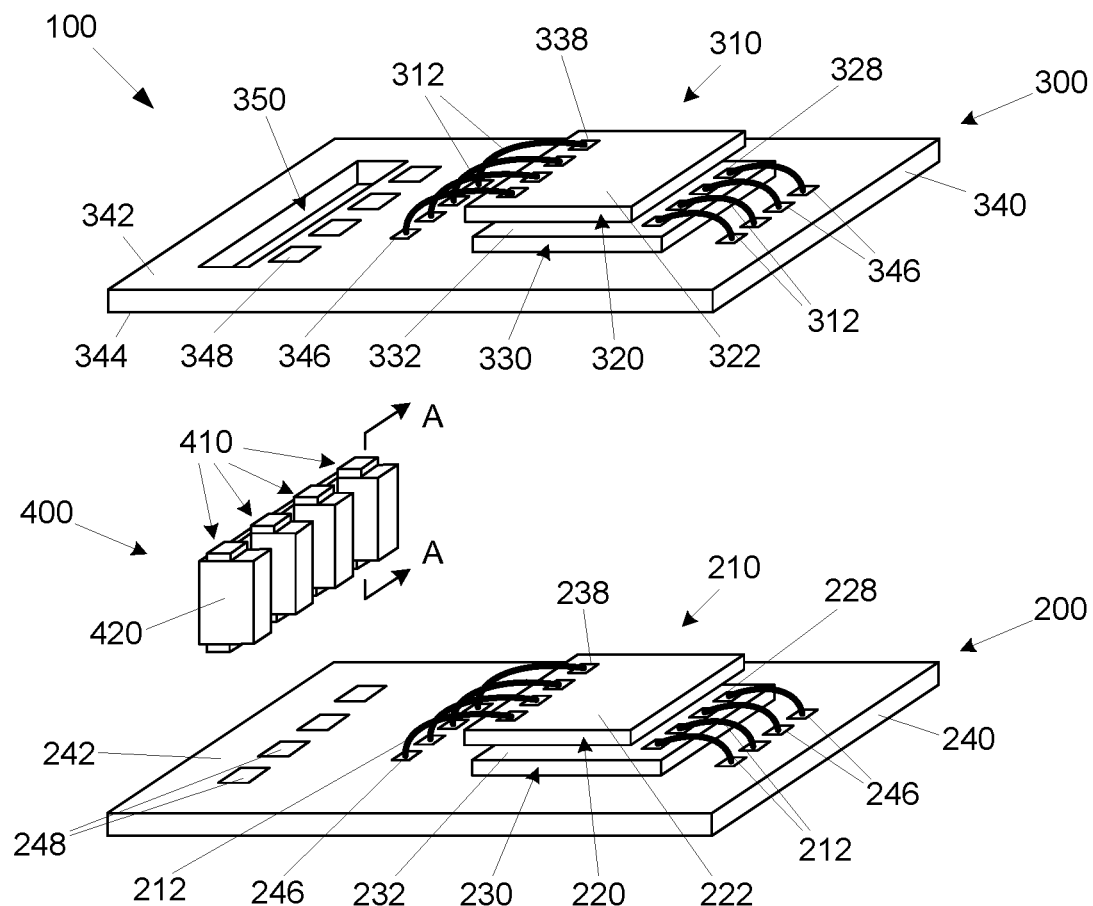
FIG. 1 illustrates an oblique, exploded view of an integrated circuit structure, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer or component with respect to other layers or components. One layer/component "over" or "on" another layer/component or bonded "to" another layer/component may be directly in contact with the other layer/component or may have one or more intervening layers/components. One layer/component "between" layers/components may be directly in contact with the layers/components or may have one or more intervening layers/components.

Embodiments of the present description include an integrated circuit structure having a first integrated circuit package comprising a first integrated circuit device electrically attached to a first surface of a first substrate, a second integrated circuit package comprising a second integrated circuit device electrically attached to a first surface of a second substrate and an opening extending between a first surface of the second substrate and the second surface of the second substrate, and an interconnection structure electrically attached to the first surface of the first substrate, wherein a portion of the interconnection structure extends into the second substrate opening and wherein the interconnection structure is electrically attached to a first surface of the second substrate.

FIG. 1 illustrates an exploded view of an integrated circuit structure, illustrated as a package-on-package structure 100, according to one embodiment of the present description. As shown in FIG. 1, the package-on-package structure 100 may include a first integrated circuit package 200 comprising at least one first integrated circuit device 210, such as a plurality of stacked memory devices (illustrated as first integrated circuit die 220 and second integrated circuit die 230), electrically attached to a first substrate 240, such as an interposer, through a plurality of electrical connectors 212 (illustrated as bond wires). The electrical connectors 212 may extend between bond pads 228 on an active surface 222 of the first integrated circuit die 220 and corresponding bond pads 246 on a first surface 242 of the first substrate 240, and may extend between bond pads 238 on an active surface 232 of the second integrated circuit die 230 and corresponding bond pads 246 on a first surface 242 of the first substrate 240. The first integrated circuit die bond pads 228 and the second integrated circuit die bond pads 238 may be in electrical communication with integrated circuity (not show) within the first integrated circuit die 220 and the second integrated circuit die 230, respectively. The first integrated circuit package 200 may include at least one interconnect attachment contact 248 formed on or in the first substrate first surface 242.

The first substrate bond pads 246 may be in electrical communication with conductive routes (not shown) within the first substrate 240. The conductive routes (not shown) may provide electrical communication routes between the first integrated circuit device 210 on the first substrate 240 and other components (not shown) mounted on the first substrate 240, and/or may provide electrical communication routes between the first integrated circuit device 210 on the first substrate 240 and the interconnect attachment contacts 248 of the first substrate 240. Although the first integrated circuit device 210 is illustrated as a plurality of stacked memory devices (i.e. first integrated circuit die 220 and second integrated circuit die 230), embodiments of the present description are not so limited, as the first integrated circuit device 210 may be a single die and/or may include any appropriate device such as a microprocessor, a multichip package, a chipset, a graphics device, a wireless device, a memory device, an application specific integrated circuit device, and/or the like.

As further shown in FIG. 1, the package-on-package structure 100 may include a second integrated circuit package 300 comprising at least one second integrated circuit device 310, such as a plurality of stacked memory devices (illustrated as first integrated circuit die 320 and second integrated circuit die 330), electrically attached to a second substrate 340, such as an interposer, through a plurality of electrical connectors 312 (illustrated as bond wires). The electrical connectors 312 may extend between bond pads 328 on an active surface 322 of the first integrated circuitry die 320 and corresponding bond pads 346 on a first surface 342 of the second substrate 340, and may extend between bond pads 338 on an active surface 332 of the second integrated circuit die 330 and corresponding bond pads 346 on a first surface 342 of the second substrate 340. The first integrated circuit die bond pads 328 and the second integrated circuit die bond pads 338 may be in electrical communication with integrated circuity (not show) within the first integrated circuit die 320 and the second integrated circuit die 330, respectively. The second integrated circuit package 300 may include at least one interconnect attachment contact 348 formed on or in the second substrate first surface 342. The second microelectronic substrate 340 may further include an opening or slot 350 formed through the second substrate 340 extending from the second substrate first surface 342 to an opposing second surface 344 of the second substrate 340.

The second substrate bond pads 346 may be in electrical communication with conductive routes (not shown) within the second substrate 340. The conductive routes (not shown) may provide electrical communication routes between the second integrated circuit device 310 on the second substrate 340 and other components (not shown) mounted on the second substrate 340 and/or may provide electrical communication routes between the second integrated circuit device 310 on the second substrate 340 and the interconnect attachment contacts 348 of the second substrate 340. Although the second integrated circuit device 310 is illustrated as a plurality of stacked memory devices (i.e. first integrated circuit die 320 and second integrated circuit die 330), embodiments of the present description are not so limited, as the second integrated circuit device 310 may be a single die and/or may include any appropriate device such as a microprocessor, a multichip package, a chipset, a graphics device, a wireless device, a memory device, an application specific integrated circuit device, and/or the like.

The first substrate 240 and the second substrate 340 may comprise any appropriate dielectric material, including, by not limited to, liquid crystal polymer, epoxy resin, bismaleimide triazine resin, FR4, polyimide materials, and the like. It is understood that the first substrate 240 and the second substrate 340 may be formed from any number of dielectric layers and conductive routes and may contain active and/or passive microelectronic devices (not shown) formed therein. It is also understood that solder resist layers (not shown) could be utilized on the first substrate first surface 242 and/or the second substrate first surface 342, as will be understood to those skilled in the art. The processes used for forming the first substrate 240 and the second substrate 340 are well known to those skilled in the art, and for the sake of brevity and conciseness will not be described or illustrated herein.

Although the plurality of electrical connectors 212 of the first integrated circuit package 200 and the plurality of electrical connectors 312 of the second integrated circuit package 300 are show as bond wires, as known in the art, the embodiments of the present description are not so limited. For example, the plurality of electrical connectors 212 of the first integrated circuit package 200 and/or the plurality of electrical connectors 312 of the second integrated circuit package 300 may be solder material or conductive filled epoxy electrically connecting the first integrated circuit die 210 and/or the second integrated circuit die 310 to the first substrate 240 and the second substrate 340, respectively, in a configuration generally known as a flip-chip or controlled collapse chip connection ("C4") configuration.

Figure 2:
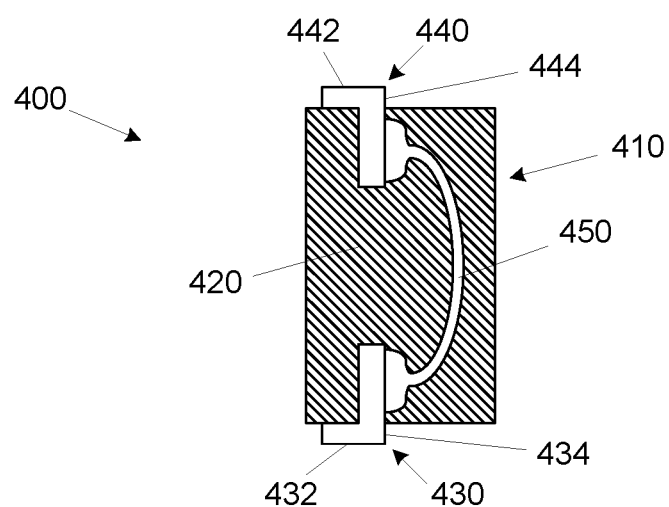
FIG. 2 illustrates a side cross sectional view of a discrete conductive element of the interconnection structure along line A-A of FIG. 1, according to one embodiment of the present description.

As still further shown in FIG. 1, the package-on-package structure 100 may include an interconnection structure 400 for electrically connecting the first integrated circuit package 200 with the second integrated circuit package 300. As shown in FIG. 1, the interconnection structure 400 may include a plurality of discrete conductive elements 410 encased in an encapsulant material 420, such as an epoxy. As shown in FIG. 2 (a cross-section along line A-A of FIG. 1), each conductive element 410 may comprise a first interconnection pad 430 and an opposing second interconnection pad 440 with a bond wire 450 extending between and welded or fused to the first interconnection pad 430 and the second interconnection pad 440. The first interconnection pad 430 may include a package connection surface 432 and a bond wire attachment surface 434, and the second interconnection pad 440 may also include a package connection surface 442 and a bond wire attachment surface 444. In one embodiment, as illustrated, the package connection surface 432 of the first interconnection pad 430 may be substantially perpendicular to the bond wire attachment surface 434 of the first interconnection pad 430, and the package connection surface 442 of the second interconnection pad 440 may be substantially perpendicular to the bond wire attachment surface 444 of the second interconnection pad 440. In a further embodiment, as illustrated, the first interconnection pad 430 may be oriented to the second interconnection pad 440 such that the package connection surface 432 of the first interconnection pad 430 is substantially parallel to the package connection surface 442 of the second interconnection pad 440 and such that the bond wire attachment surface 434 of the first interconnection pad 430 is in substantially the same plane (e.g. planar) with the bond wire attachment surface 444 of the second interconnection pad 440. As shown, the bond wire 450 may extend between and be welded to the bond wire attachment surface 434 of the first interconnection pad 430 and the bond wire attachment surface 444 of the second interconnection pad 440. The first interconnection pad 430, the second interconnection pad 440, and the bond wire 450 may be formed from any appropriate conductive material, including, but not limited to, copper, aluminum, silver, gold, alloys thereof, and the like.

Figure 3:
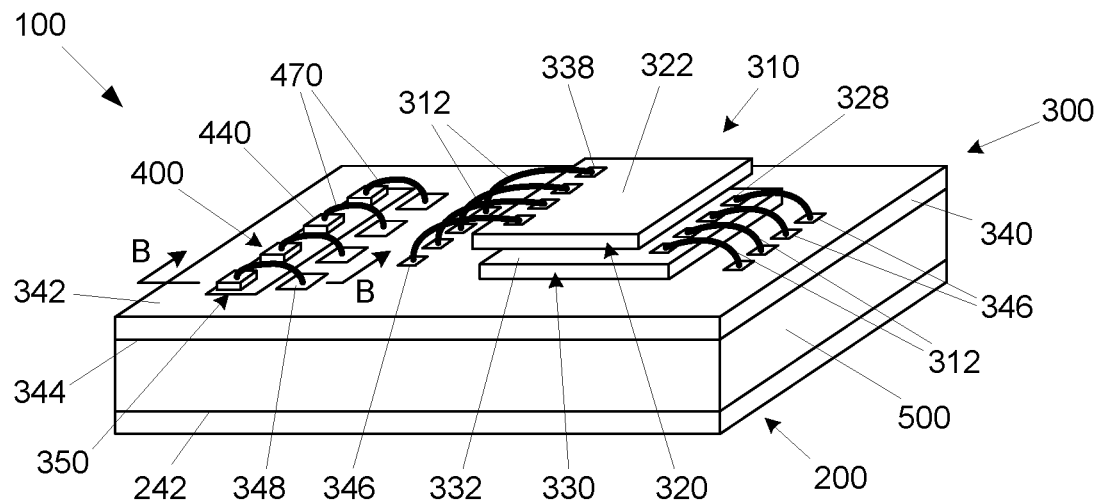
FIG. 3 illustrates an oblique view of an intermediate assembled configuration of the integrated circuit structure, according to an embodiment of the present description.
Figure 4:
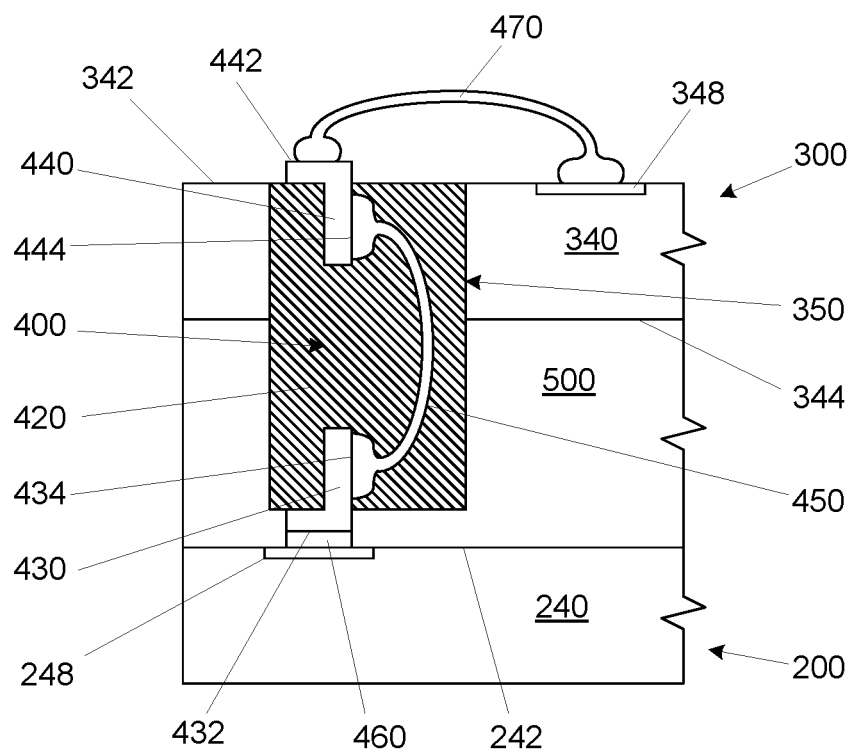
FIG. 4 illustrates a side cross sectional view of a conductive element of the interconnection structure along line B-B of FIG. 3, according to one embodiment of the present description.

FIGS. 3 and 4 illustrate an intermediate assembled configuration of the package-on-package structure 100. As shown in FIG. 4, the first interconnection pads 430 of the interconnection structure 400 may be electrically attached to their respective interconnect attachment contacts 248 formed on or in the first substrate first surface 242, such as by any know surface mount technology, including but not limited to forming a layer of solder 460 between the first interconnection pad 430 and the interconnect attachment contact 248. The second integrated circuit package 300 may be stacked over the first integrated circuit package 200 such that a portion of the interconnection structure 400 extends into the opening 350 extending through the second substrate 340 of the second integrated circuit package 300. The second interconnection pads 440 of the interconnection structure 400 may then be electrically connected to their respective interconnect attachment contacts 348 formed on or in the second substrate first surface 342, such as by bond wires 470. As shown in FIGS. 3 and 4, the first integrated circuit package 200 may be attached to the second integrated circuit package 300 with a mold material 500, such as a filled epoxy, disposed between the first substrate first surface 242 and the second substrate second surface 344. It is understood that during that attachment of the first integrated circuit package 200 to the second integrated circuit package 300, an epoxy or underfill (not shown) can be used around the opening 350 and the interconnection structure 400 to temporary fix the first integrated circuit package 200 and the second integrated circuit package 300 during the disposition of the mold material 500, and to prevent bleed out the mold material 500.

Figure 5:
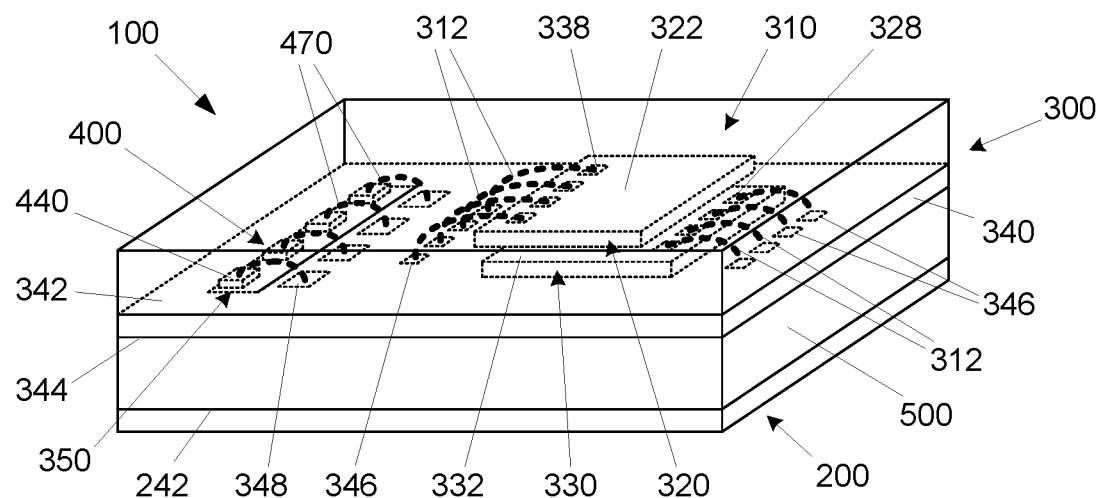
FIG. 5 illustrates an oblique view of an assembled configuration of the integrated circuit structure, according to an embodiment of the present description.

As shown in FIG. 5, a capping mold material 510 may be formed over the second substrate first surface 342 and the integrated circuit die 310 to form the package-on-package structure 100. The components proximate the second substrate first surface 342, as shown in FIG. 4, are illustrated in shadow line for clarity.

Figure 6:
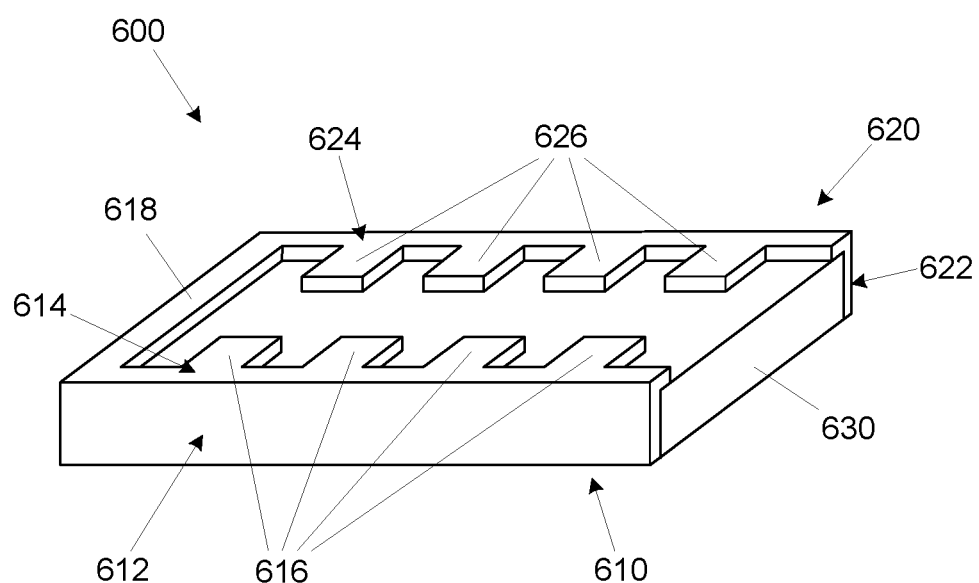
FIGS. 6-10 illustrate various view of a method of forming an interconnect structure, according to one embodiment of the present description.

FIGS. 6-10 illustrate a method of forming the interconnect structure 400, such as shown in FIG. 1-5. As shown in FIG. 6, a first intermediate structure 600 may be formed comprising a first L-beam 610 positioned opposite a second L-beam 620 with an encapsulant material structure 630 disposed therebetween. The first L-beam 610 may include a package connection surface 612 which is substantially perpendicular to a bond wire attachment surface 614, wherein the bond wire attachment surface 614 may have a plurality of tabs 616 extending therefrom. The second L-beam 620 may also include a package connection surface 622 which is substantially perpendicular to a bond wire attachment surface 624, wherein the bond wire attachment surface 624 may have a plurality of tabs 626 extending therefrom. As further shown in FIG. 6, a crossmember 618 may be attached between the first L-beam 610 and the second L-beam 620 for structural support.

Figure 7:
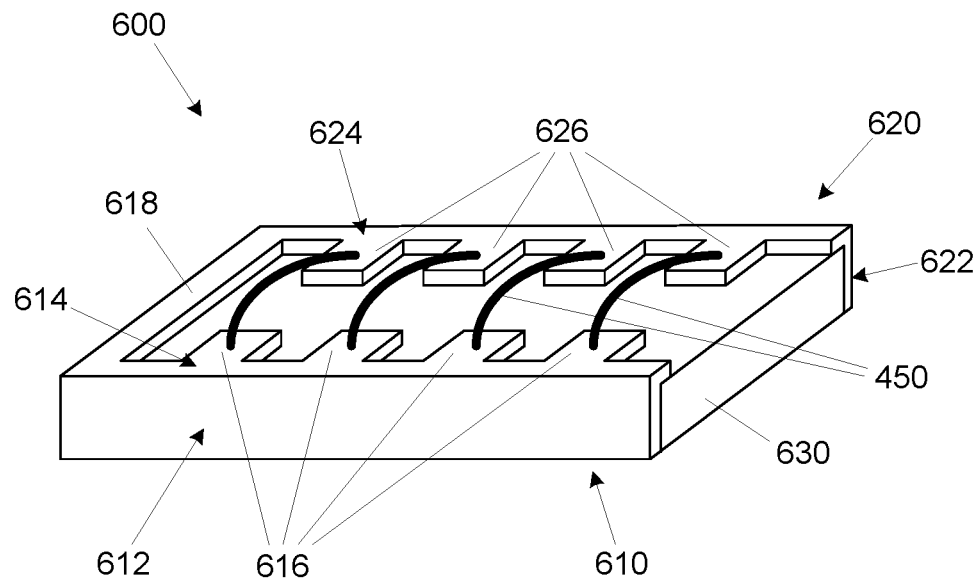
Figure 8:
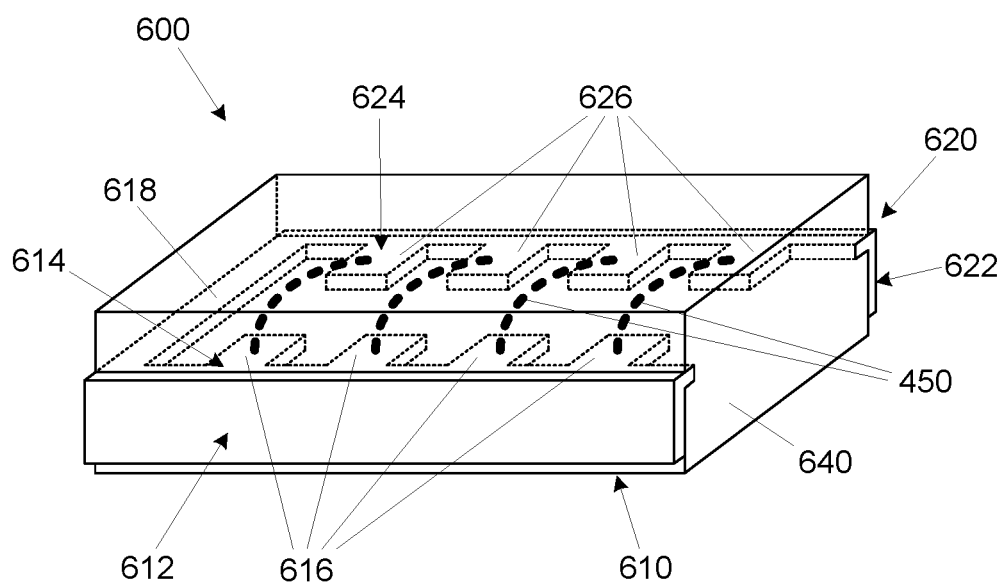
Figure 9:
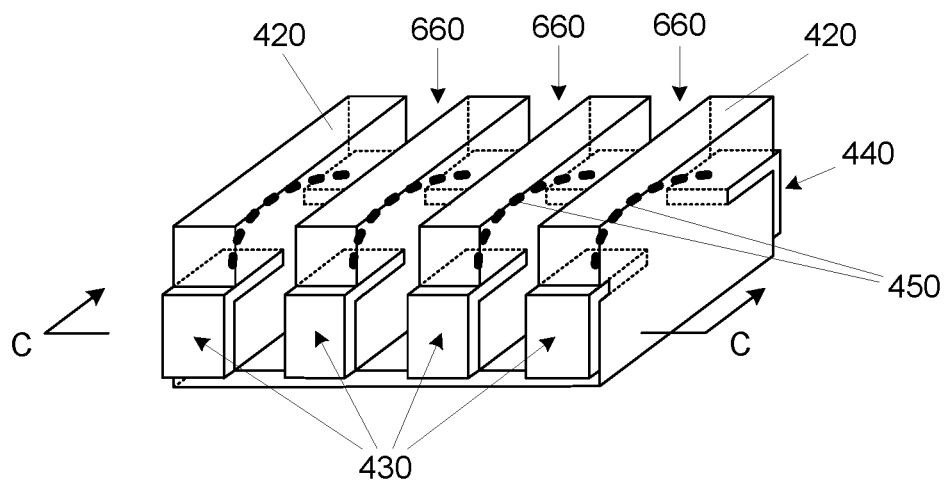
Figure 10:
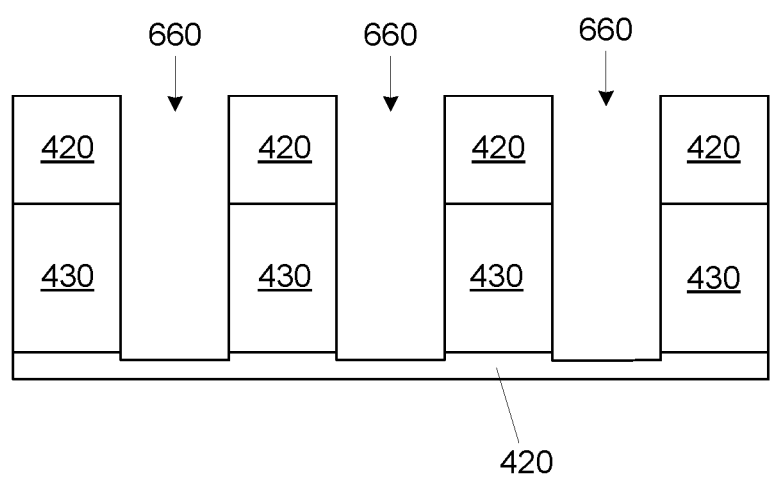

As shown in FIG. 7, the bond wires 450 may be attached between the first L-beam tabs 616 and the second L-beam tabs 626. As shown in FIG. 8, a capping encapsulant material layer 640 may be formed over the first L-beam 610, the second L-beam 620, and the bond wires 450. As shown in FIGS. 9 and 10 (side view along line C-C of FIG. 9), the first L-beam 610 (see FIG. 8) and the second L-beam 620 (see FIG. 8) may be cut into discrete portions by any known method to form the first interconnection pads 430 and the second interconnection pads 440. As shown, this may be achieved by cutting trenches 660 through the capping encapsulant material layer 640 (see FIG. 8) to form the encapsulant material 420, as also shown in FIGS. 1-5.

Figure 11:
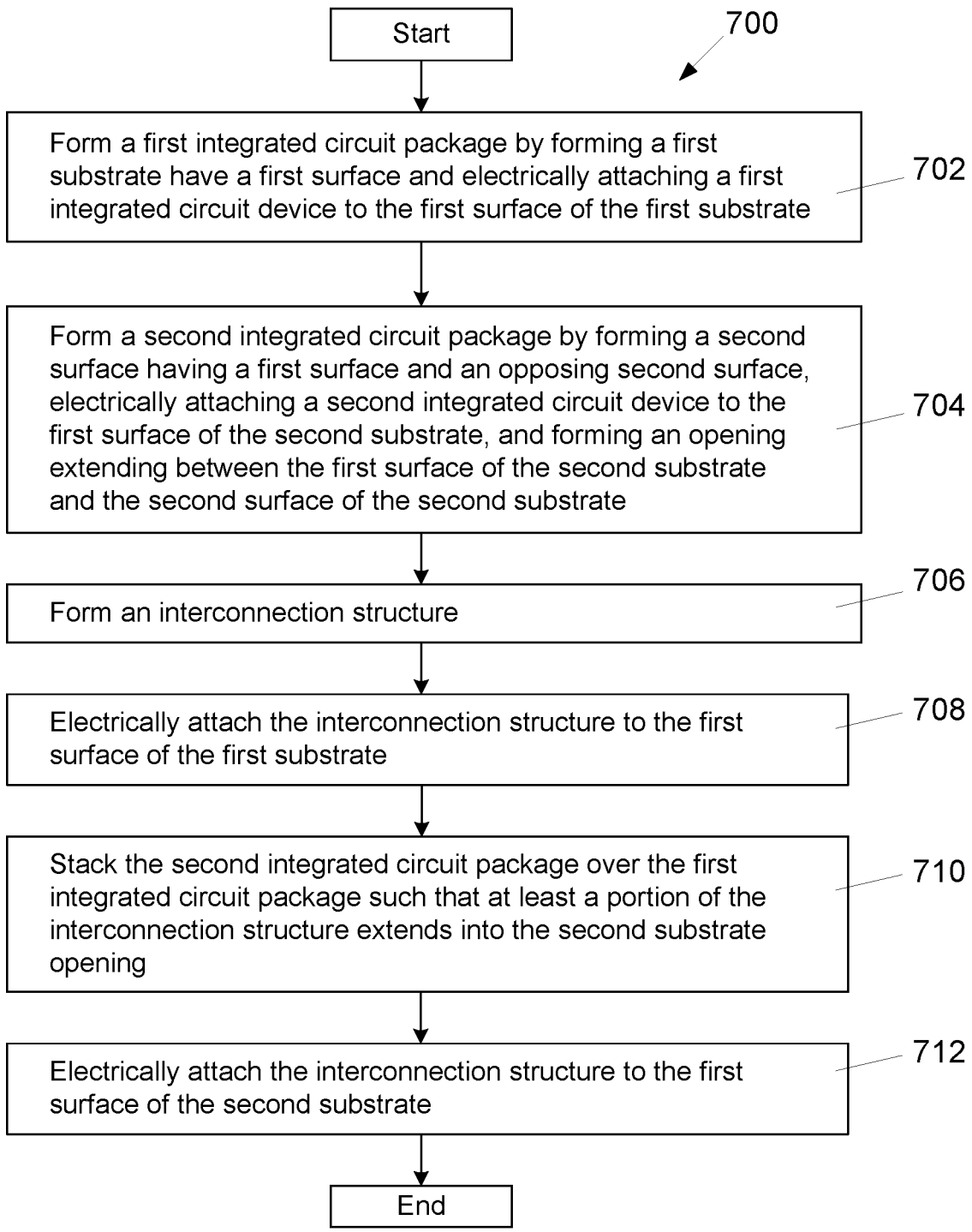
FIG. 11 is a flow chart of a process 700 of fabricating a microelectronic package, according to an embodiment of the present description.

FIG. 11 is a flow chart of a process 700 of fabricating an integrated circuit structure, according to an embodiment of the present description. As set forth in block 702, a first integrated circuit package may be formed by forming a first substrate having a first surface and electrically attaching a first integrated circuit device to the first surface of the first substrate. A second integrated circuit package may be formed by forming a second substrate having a first surface and an opposing second surface, electrically attaching a second integrated circuit device to the first surface of the second substrate, and forming an opening extending between the first surface of the second substrate and the second surface of the second substrate, as set forth in block 704. As set forth in block 706, an interconnection structure may be formed. The interconnection structure may then be electrically attached to the first surface of the first substrate, as set forth in block 708. As set forth in block 710, the second integrated circuit package may be stacked on the first integrated circuit package such that at least a portion of the interconnection structure extends into the second substrate opening. The interconnection structure may then be electrically attached to a first surface of the second substrate, as set forth in block 712.

Figure 12:
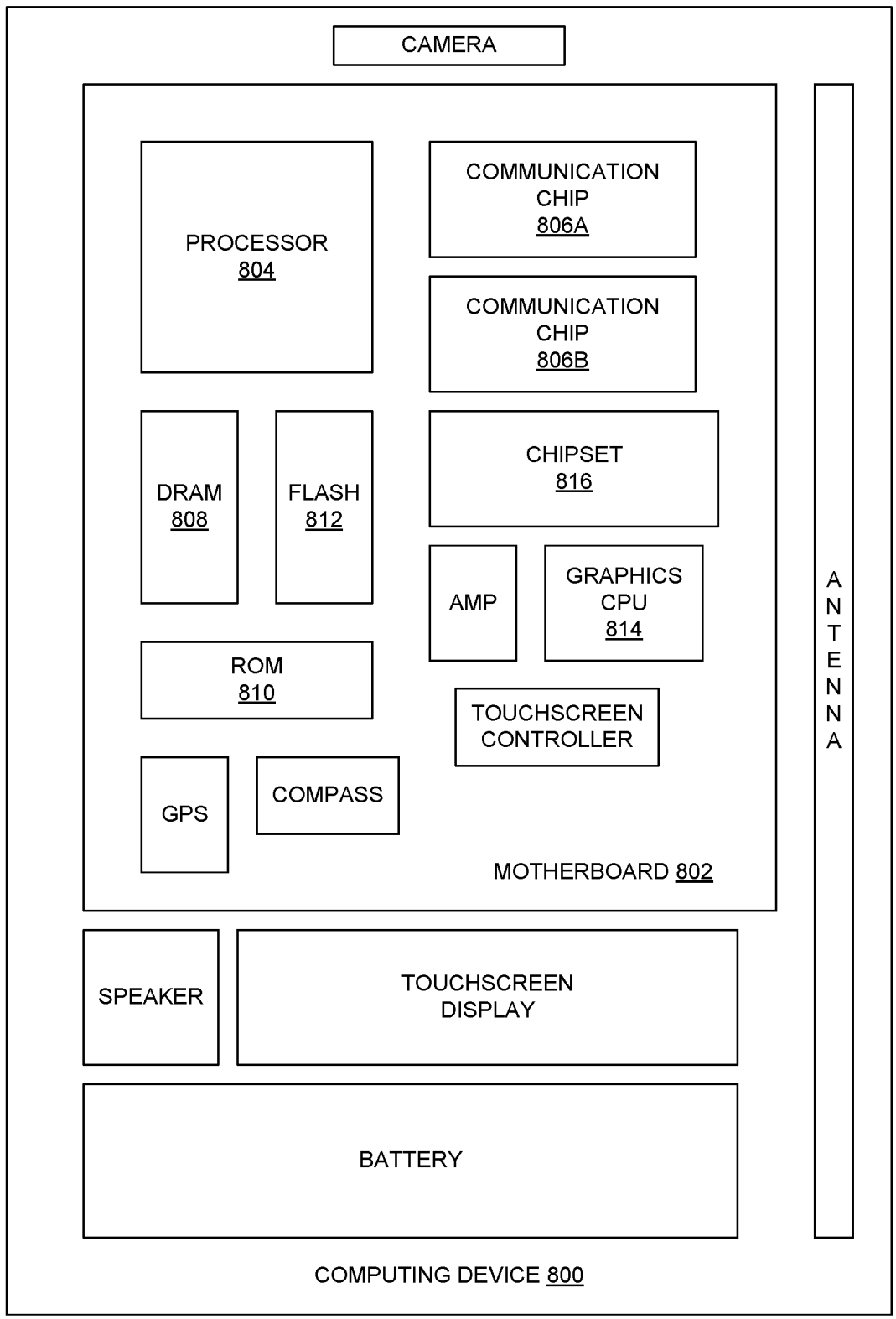
FIG. 12 illustrates a computing device in accordance with one implementation of the present description.

FIG. 12 illustrates a computing device 800 in accordance with one implementation of the present description. The computing device 800 houses a board 802. The board may include a number of integrated circuit components, including but not limited to a processor 804, at least one communication chip 806A, 806B, volatile memory 808, (e.g., DRAM), non-volatile memory 810 (e.g., ROM), flash memory 812, a graphics processor or CPU 814, a digital signal processor (not shown), a crypto processor (not shown), a chipset 816, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the integrated circuit components may be physically and electrically coupled to the board 802. In some implementations, at least one of the integrated circuit components may be a part of the processor 804.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the integrated components within the computing device 800 may include an integrated circuit structure having a first integrated circuit package comprising a first integrated circuit device electrically attached to a first surface of a first substrate, a second integrated circuit package comprising a second integrated circuit device electrically attached to a first surface of a second substrate and an opening extending between a first surface of the second substrate and the second surface of the second substrate, and an interconnection structure electrically attached to the first surface of the first substrate, wherein a portion of the interconnection structure extends into the second substrate opening and wherein the interconnection structure is electrically attached to a first surface of the second substrate.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-12. The subject matter may be applied to other integrated circuit package configurations, as will be understood to those skilled in the art.

The following examples pertain to further embodiments, wherein Example 1 is an integrated circuit structure comprising a first integrated circuit package comprising a first integrated circuit device electrically attached to a first surface of a first substrate, a second integrated circuit package comprising a second integrated circuit device electrically attached to a first surface of a second substrate and an opening extending between the first surface of the second substrate and an opposing second surface of the second substrate, and an interconnection structure electrically attached to the first surface of the first substrate, wherein at least a portion of the interconnection structure extends into the second substrate opening and wherein the interconnection structure is electrically attached to the first surface of the second substrate.

In Example 2, the subject matter of Example 1 can optionally include the interconnection structure comprising a plurality of conductive elements encased in an encapsulant material, wherein each conductive element of the plurality of conductive elements comprises a first interconnection pad and an opposing second interconnection pad with a bond wire electrically attached to the first interconnection pad and electrically attached to the second interconnection pad.

In Example 3, the subject matter of Example 2 can optionally include the first interconnection pad comprises a package connection surface and a bond wire attachment surface, and wherein the second interconnection pad comprises a package connection surface and a bond wire attachment surface.

In Example 4, the subject matter of Example 3 can optionally include the package connection surface of the first interconnection pad being substantially perpendicular to the bond wire attachment surface of the first interconnection pad, and wherein the package connection surface of the second interconnection pad is substantially perpendicular to the bond wire attachment surface of the second interconnection pad.

In Example 5, the subject matter of Example 4 can optionally include the first interconnection pad being oriented to the second interconnection pad such that the package connection surface of the first interconnection pad is substantially parallel to the package connection surface of the second interconnection pad, and such that the bond wire attachment surface of the first interconnection pad is in substantially the same plane with the bond wire attachment surface of the second interconnection pad.

In Example 6, the subject matter of any of Examples 3 to 5 can optionally include the bond wire being electrically attached to the bond wire attachment surface of the first interconnection pad and the bond wire attachment surface of the second interconnection pad.

In Example 7, the subject matter of any of Examples 1 to 5 can optionally include the interconnect structure being electrically attached to the first surface of the second substrate with a bond wire.

In Example 8, the subject matter of any of Examples 1 to 5 can optionally include the interconnect structure being electrically attached to the first surface of the first substrate with a layer of solder.

In Example 9, the subject matter of any of Examples 1 to 5 can optionally include at least one of the first integrated circuit device and the second integrated circuit device comprising a plurality of stacked integrated circuit dice.

In Example 10, the subject matter of Example 9 can optionally include the plurality of stacked integrated circuit dice comprises a plurality of stacked memory devices.

In Example 11, the subject matter of any of Examples 1 to 5 can optionally include a mold material between the first surface of the first substrate and the second surface of the second substrate.

In Example 12, the subject matter of any of Examples 1 to 5 can optionally include a capping mold material disposed on the first surface of the second substrate and disposed on the second integrated circuit device.

The following examples pertain to further embodiments, wherein Example 13 is a method of fabricating an integrated circuit structure, comprising: forming a first integrated circuit package comprising forming a first substrate having a first surface and an opposing second surface and electrically attaching a first integrated circuit device to the first surface of the first substrate; forming a second integrated circuit package comprising forming a second substrate having a first surface and an opposing second surface, electrically attaching a second integrated circuit device to the first surface of the second substrate, and forming an opening extending between the first surface of the second substrate and the second surface of the second substrate; forming an interconnection structure; electrically attaching the interconnection structure to the first surface of the first substrate; stacking the second integrated circuit package over the first integrated circuit package such that at least a portion of the interconnection structure extends into the second substrate opening; and electrically attaching the interconnection structure to a first surface of the second substrate.

In Example 14, the subject matter of Example 13 can optionally include forming the interconnection structure comprising forming a plurality of conductive elements encased in an encapsulant material, wherein forming each conductive element of the plurality of conductive elements comprises forming a first interconnection pad, forming an opposing second interconnection pad, and electrically attaching a bond wire to the first interconnection pad and the second interconnection pad.

In Example 15, the subject matter of Example 14 can optionally include forming the first interconnection pad comprising forming a package connection surface and forming a bond wire attachment surface, and wherein forming the second interconnection pad comprises forming a package connection surface and forming a bond wire attachment surface.

In Example 16, the subject matter of Example 15 can optionally include forming the package connection surface of the first interconnection pad substantially perpendicular to the bond wire attachment surface of the first interconnection pad, and further comprising forming the package connection surface of the second interconnection pad substantially perpendicular to the bond wire attachment surface of the second interconnection pad.

In Example 17, the subject matter of Example 16 can optionally include orienting the first interconnection pad to the second interconnection pad such that the package connection surface of the first interconnection pad is substantially parallel to the package connection surface of the second interconnection pad, and such that the bond wire attachment surface of the first interconnection pad is in substantially the same plane with the bond wire attachment surface of the second interconnection pad.

In Example 18, the subject matter of any of Examples 15 to 17 can optionally include electrically attaching the bond wire to the bond wire attachment surface of the first interconnection pad and the bond wire attachment surface of the second interconnection pad.

In Example 19, the subject matter of any of Examples 13 to 17 can optionally include electrically attaching the interconnect structure to the first surface of the second substrate with a bond wire.

In Example 20, the subject matter of any of Examples 13 to 17 can optionally include electrically attaching the interconnect structure to the first surface of the first substrate comprising electrically attaching the interconnect structure to the first surface of the first substrate with a layer of solder.

In Example 21, the subject matter of any of Examples 13 to 17 can optionally include at least one of the first integrated circuit device and the second integrated circuit device comprising a plurality of stacked integrated circuit dice.

In Example 22, the subject matter of any of Examples 13 to 17 can optionally include the plurality of stacked integrated circuit dice comprises a plurality of stacked memory devices.

In Example 23, the subject matter of any of Examples 13 to 17 can optionally include disposing a mold material between the first surface of the first substrate and the second surface of the second substrate.

In Example 24, the subject matter of any of Examples 13 to 17 can optionally include disposing a capping mold material on the first surface of the second substrate and on the second integrated circuit device.

In Example 25, the subject matter of any of Examples 13 to 17 can optionally include forming the interconnection structure comprising: forming an intermediate structure comprising positioning a first L-beam positioned opposite a second L-beam with an encapsulant material structure disposed therebetween; wherein the first L-beam includes a package connection surface which is substantially perpendicular to a bond wire attachment surface and the bond wire attachment surface has a plurality of tabs extending therefrom;

wherein the second L-beam includes a package connection surface which is substantially perpendicular to a bond wire attachment surface, and the bond wire attachment surface has a plurality of tabs extending therefrom; attaching bond wires between the first L-beam tabs and the second L-beam tabs; forming a capping encapsulant material layer over the first L-beam, the second L-beam, and the bond wires; and cutting the first L-beam and the second L-beam into discrete portions to form a plurality of first interconnection pads and a plurality of the second interconnection pads.

The following examples pertain to further embodiments, wherein Example 26 is an electronic system, comprising: a board; and an integrated circuit component attached to the board, wherein the integrated circuit component includes an integrated circuit structure comprising a first integrated circuit package comprising a first integrated circuit device electrically attached to a first surface of a first substrate, a second integrated circuit package comprising a second integrated circuit device electrically attached to a first surface of a second substrate and an opening extending between the first surface of the second substrate and an opposing second surface of the second substrate, and an interconnection structure electrically attached to the first surface of the first substrate, wherein at least a portion of the interconnection structure extends into the second substrate opening and wherein the interconnection structure is electrically attached to the first surface of the second substrate.

In Example 27, the subject matter of Example 26 can optionally include the interconnection structure comprising a plurality of conductive elements encased in an encapsulant material, wherein each conductive element of the plurality of conductive elements comprises a first interconnection pad and an opposing second interconnection pad with a bond wire electrically attached to the first interconnection pad and electrically attached to the second interconnection pad.

In Example 28, the subject matter of Example 27 can optionally include the first interconnection pad comprises a package connection surface and a bond wire attachment surface, and wherein the second interconnection pad comprises a package connection surface and a bond wire attachment surface.

In Example 29, the subject matter of Example 28 can optionally include the package connection surface of the first interconnection pad being substantially perpendicular to the bond wire attachment surface of the first interconnection pad, and wherein the package connection surface of the second interconnection pad is substantially perpendicular to the bond wire attachment surface of the second interconnection pad.

In Example 30, the subject matter of Example 29 can optionally include the first interconnection pad being oriented to the second interconnection pad such that the package connection surface of the first interconnection pad is substantially parallel to the package connection surface of the second interconnection pad, and such that the bond wire attachment surface of the first interconnection pad is in substantially the same plane with the bond wire attachment surface of the second interconnection pad.

In Example 31, the subject matter of any of Examples 28 to 30 can optionally include the bond wire being electrically attached to the bond wire attachment surface of the first interconnection pad and the bond wire attachment surface of the second interconnection pad.

In Example 32, the subject matter of any of Examples 26 to 30 can optionally include the interconnect structure being electrically attached to the first surface of the second substrate with a bond wire.

In Example 33, the subject matter of any of Examples 26 to 30 can optionally include the interconnect structure being electrically attached to the first surface of the first substrate with a layer of solder.

In Example 34, the subject matter of any of Examples 26 to 30 can optionally include at least one of the first integrated circuit device and the second integrated circuit device comprising a plurality of stacked integrated circuit dice.

In Example 35, the subject matter of Example 34 can optionally include the plurality of stacked integrated circuit dice comprises a plurality of stacked memory devices.

In Example 36, the subject matter of any of Examples 26 to 30 can optionally include a mold material between the first surface of the first substrate and the second surface of the second substrate.

In Example 37, the subject matter of any of Examples 26 to 30 can optionally include a capping mold material disposed on the first surface of the second substrate and disposed on the second integrated circuit device.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. An integrated circuit structure, comprising:
a first integrated circuit package comprising a first integrated circuit device electrically attached to a first surface of a first substrate;
a second integrated circuit package comprising a second integrated circuit device electrically attached to a first surface of a second substrate and an opening extending between the first surface of the second substrate and an opposing second surface of the second substrate; and
an interconnection structure electrically attached to the first surface of the first substrate, wherein at least a portion of the interconnection structure extends into the second substrate opening, wherein the interconnection structure is electrically attached to the first surface of the second substrate, and wherein the interconnection structure comprises a plurality of conductive elements encased in an encapsulant material, wherein each conductive element of the plurality of conductive elements comprises a first interconnection pad and an opposing second interconnection pad with a bond wire electrically attached to the first interconnection pad and electrically attached to the second interconnection pad.

2. The integrated circuit structure of claim 1, wherein the first interconnection pad comprises a package connection surface and a bond wire attachment surface, and wherein the second interconnection pad comprises a package connection surface and a bond wire attachment surface.

3. The integrated circuit structure of claim 2, wherein the package connection surface of the first interconnection pad is substantially perpendicular to the bond wire attachment surface of the first interconnection pad, and wherein the package connection surface of the second interconnection pad is substantially perpendicular to the bond wire attachment surface of the second interconnection pad.

4. The integrated circuit structure of claim 3, wherein the first interconnection pad is oriented to the second interconnection pad such that the package connection surface of the first interconnection pad is substantially parallel to the package connection surface of the second interconnection pad, and such that the bond wire attachment surface of the first interconnection pad is in substantially the same plane with the bond wire attachment surface of the second interconnection pad.

5. The integrated circuit structure of claim 2, wherein the bond wire is electrically attached to the bond wire attachment surface of the first interconnection pad and the bond wire attachment surface of the second interconnection pad.

6. An integrated circuit structure, comprising:
a first integrated circuit package comprising a first integrated circuit device electrically attached to a first surface of a first substrate;
a second integrated circuit package comprising a second integrated circuit device electrically attached to a first surface of a second substrate and an opening extending between the first surface of the second substrate and an opposing second surface of the second substrate; and
an interconnection structure electrically attached to the first surface of the first substrate, wherein at least a portion of the interconnection structure extends into the second substrate opening, wherein the interconnection structure is electrically attached to the first surface of the second substrate, and wherein the interconnect structure is electrically attached to the first surface of the second substrate with a bond wire.

7. The integrated circuit structure of claim 1, wherein the interconnect structure is electrically attached to the first surface of the first substrate with a layer of solder.

8. The integrated circuit structure of claim 1, wherein at least one of the first integrated circuit device and the second integrated circuit device comprises a plurality of stacked integrated circuit dice.

9. The integrated circuit structure of claim 1, further comprising a mold material between the first surface of the first substrate and the second surface of the second substrate.

10. The integrated circuit structure of claim 6, wherein the interconnect structure is electrically attached to the first surface of the first substrate with a layer of solder.

11. The integrated circuit structure of claim 6, wherein at least one of the first integrated circuit device and the second integrated circuit device comprises a plurality of stacked integrated circuit dice.

12. The integrated circuit structure of claim 6, further comprising a mold material between the first surface of the first substrate and the second surface of the second substrate.

13. An electronic system, comprising:
a board; and
an integrated circuit component attached to the board, wherein the integrated circuit component includes an integrated circuit structure, comprising:
a first integrated circuit package comprising a first integrated circuit device electrically attached to a first surface of a first substrate;
a second integrated circuit package comprising a second integrated circuit device electrically attached to a first surface of a second substrate and an opening extending between the first surface of the second substrate and an opposing second surface of the second substrate; and
an interconnection structure electrically attached to the first surface of the first substrate, wherein at least a portion of the interconnection structure extends into the second substrate opening, wherein the interconnection structure is electrically attached to the first surface of the second substrate, and wherein the interconnection structure comprises a plurality of conductive elements encased in an encapsulant material, wherein each conductive element of the plurality of conductive elements comprises a first interconnection pad and an opposing second interconnection pad with a bond wire electrically attached to the first interconnection pad and electrically attached to the second interconnection pad.

14. The electronic system of claim 13, wherein the first interconnection pad comprises a package connection surface and a bond wire attachment surface, wherein the second interconnection pad comprises a package connection surface and a bond wire attachment surface, wherein the package connection surface of the first interconnection pad is substantially perpendicular to the bond wire attachment surface of the first interconnection pad, wherein the package connection surface of the second interconnection pad is substantially perpendicular to the bond wire attachment surface of the second interconnection pad, wherein the first interconnection pad is oriented to the second interconnection pad such that the package connection surface of the first interconnection pad is substantially parallel to the package connection surface of the second interconnection pad, and such that the bond wire attachment surface of the first interconnection pad is in substantially the same plane with the bond wire attachment surface of the second interconnection pad.

15. The electronic system of claim 13, wherein the first interconnection pad comprises a package connection surface and a bond wire attachment surface, and wherein the second interconnection pad comprises a package connection surface and a bond wire attachment surface.

16. The electronic system of claim 15, wherein the package connection surface of the first interconnection pad is substantially perpendicular to the bond wire attachment surface of the first interconnection pad, and wherein the package connection surface of the second interconnection pad is substantially perpendicular to the bond wire attachment surface of the second interconnection pad.

17. The electronic system of claim 16, wherein the first interconnection pad is oriented to the second interconnection pad such that the package connection surface of the first interconnection pad is substantially parallel to the package connection surface of the second interconnection pad, and such that the bond wire attachment surface of the first interconnection pad is in substantially the same plane with the bond wire attachment surface of the second interconnection pad.

18. The electronic system of claim 15, wherein the bond wire is electrically attached to the bond wire attachment surface of the first interconnection pad and the bond wire attachment surface of the second interconnection pad.

19. The electronic system of claim 13, wherein the interconnect structure is electrically attached to the first surface of the first substrate with a layer of solder.

20. The electronic system of claim 13, wherein at least one of the first integrated circuit device and the second integrated circuit device comprises a plurality of stacked integrated circuit dice.

21. The electronic system of claim 13, further comprising a mold material between the first surface of the first substrate and the second surface of the second substrate.

22. An electronic system, comprising:
a board; and
an integrated circuit component attached to the board, wherein the integrated circuit component includes an integrated circuit structure, comprising:
a first integrated circuit package comprising a first integrated circuit device electrically attached to a first surface of a first substrate;
a second integrated circuit package comprising a second integrated circuit device electrically attached to a first surface of a second substrate and an opening extending between the first surface of the second substrate and an opposing second surface of the second substrate; and an interconnection structure electrically attached to the first surface of the first substrate, wherein at least a portion of the interconnection structure extends into the second substrate opening, wherein the interconnection structure is electrically attached to the first surface of the second substrate, and wherein the interconnect structure is electrically attached to the first surface of the second substrate with a bond wire.

23. The electronic system of claim 22, wherein the interconnect structure is electrically attached to the first surface of the first substrate with a layer of solder.

24. The electronic system of claim 22, wherein at least one of the first integrated circuit device and the second integrated circuit device comprises a plurality of stacked integrated circuit dice.

25. The electronic system of claim 22, further comprising a mold material between the first surface of the first substrate and the second surface of the second substrate.

* * * * *